US009848151B2

(12) United States Patent
Fujita et al.

(10) Patent No.: US 9,848,151 B2
(45) Date of Patent: Dec. 19, 2017

(54) SOLID STATE IMAGING DEVICE INCLUDING PHOTODETECTING SECTION

(71) Applicant: HAMAMATSU PHOTONICS K.K., Hamamatsu-shi, Shizuoka (JP)

(72) Inventors: Kazuki Fujita, Hamamatsu (JP); Ryuji Kyushima, Hamamatsu (JP); Junichi Sawada, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/895,261

(22) PCT Filed: May 28, 2014

(86) PCT No.: PCT/JP2014/064131
§ 371 (c)(1),
(2) Date: Dec. 2, 2015

(87) PCT Pub. No.: WO2014/196433
PCT Pub. Date: Dec. 11, 2014

(65) Prior Publication Data
US 2016/0119565 A1    Apr. 28, 2016

(30) Foreign Application Priority Data

Jun. 7, 2013 (JP) .................................. 2013-120879

(51) Int. Cl.
*H04N 5/335*    (2011.01)
*H04N 5/376*    (2011.01)
(Continued)

(52) U.S. Cl.
CPC ....... *H04N 5/376* (2013.01); *H01L 27/14603* (2013.01); *H04N 5/367* (2013.01);
(Continued)

(58) Field of Classification Search
CPC ..................................................... H04N 5/376
(Continued)

(56) References Cited

U.S. PATENT DOCUMENTS 8,085,329 B2 * 12/2011 Kitami ............... H04N 5/23245
250/208.1
2005/0051775 A1   3/2005 Meynants
(Continued)

FOREIGN PATENT DOCUMENTS

JP    H08-510883 A    11/1996
JP    2005-160024     6/2005
(Continued)

OTHER PUBLICATIONS

International Preliminary Report on Patentability dated Dec. 8, 2015 for PCT/JP2014/064131.

*Primary Examiner* — Usman Khan
(74) *Attorney, Agent, or Firm* — Drinker Biddle & Reath LLP

(57) ABSTRACT

A solid-state imaging device includes a photodetecting section, a vertical shift register section, first row selection lines, and second row selection lines. The vertical shift register section provides the row selection lines of the m-th row with common row selection signals.

4 Claims, 13 Drawing Sheets

(51) Int. Cl.
*H01L 27/146* (2006.01)
*H04N 5/367* (2011.01)
*H04N 5/374* (2011.01)
*H04N 5/3745* (2011.01)

(52) U.S. Cl.
CPC ....... *H04N 5/3742* (2013.01); *H04N 5/37457* (2013.01); *H01L 27/14643* (2013.01); *H01L 27/14663* (2013.01)

(58) Field of Classification Search
USPC .......................................................... 348/376
See application file for complete search history.

(56) References Cited

U.S. PATENT DOCUMENTS

| | | | | |
|---|---|---|---|---|
| 2005/0259490 A1* | 11/2005 | Eom | ................... | G09G 3/3275 365/221 |
| 2007/0216788 A1 | 9/2007 | Korthout et al. | | |
| 2010/0073538 A1* | 3/2010 | Cieslinski | .............. | H04N 3/155 348/301 |
| 2012/0062773 A1* | 3/2012 | Cieslinski | .............. | H04N 5/378 348/300 |
| 2012/0286138 A1* | 11/2012 | Yamazaki | .............. | H04N 5/378 250/208.1 |
| 2012/0286139 A1* | 11/2012 | Tashiro | ................ | H04N 5/3655 250/208.1 |
| 2015/0181140 A1* | 6/2015 | Onishi | ................... | H04N 5/361 348/243 |

FOREIGN PATENT DOCUMENTS

| | | |
|---|---|---|
| JP | 2007-050053 A | 3/2007 |
| JP | 2011-250926 | 12/2011 |
| JP | 2012-257332 A | 12/2012 |
| JP | 2013-084972 A | 5/2013 |
| WO | WO-94/28583 A1 | 12/1994 |

\* cited by examiner

SOLID STATE IMAGING DEVICE INCLUDING PHOTODETECTING SECTION

TECHNICAL FIELD

The present invention relates to a solid-state imaging device.

BACKGROUND ART

Patent Literature 1 describes a technique concerning a radiation imaging device. The device comprises a sensor array constructed by two-dimensionally arraying a plurality of pixels each including a conversion element for converting a radiation from an object into an electric signal and a transfer switch for transferring the electric signal to the outside. The device also comprises a plurality of gate lines connecting the pixels of the sensor array in the row direction, a gate drive device for driving the gate lines in order to read out the electric signals of the pixels connected to each gate line, a plurality of signal lines for connecting the pixels of the sensor array in the column direction, and a plurality of amplifiers, provided so as to correspond to the respective signal lines, for amplifying and reading out the electric signals transferred from the respective transfer switches.

CITATION LIST

Patent Literature

Patent Literature 1: Japanese Patent Application Laid-Open No. 2007-50053

SUMMARY OF INVENTION

Technical Problem

A solid-state imaging device has a photodetecting section in which a plurality of pixels are arrayed two-dimensionally over a plurality of rows and a plurality of columns. A photodiode for converting light incident thereon into an electron is arranged in each pixel. The photodiodes of the pixels are connected through switch circuits (e.g., transistors) to a readout line provided for each column, while charges accumulated within the photodiode flow out to the readout line when the switch circuit is turned on. The charges reach an integration circuit through the readout line and are converted into a voltage signal in the integration circuit. A control terminal (e.g., gate terminal) for controlling the conduction state of the switch circuit in each pixel is connected to a row selection line provided for each row. A signal (row selection signal) from a shift register is supplied to the control terminal of each switch circuit through the row selection line, whereby the charges are read out from the pixels for each row.

In such a solid-state imaging device, an operation of reading out the charges from each pixel also serves as a reset operation for getting ready for accumulating charges in the next frame. However, when a failure such as disconnection occurs in the row selection line, the row selection signal fails to reach pixels beyond the point of failure, whereby the switch circuit does not operate. In this case, the charges of the pixel keep accumulating in the photodiode and spill over pixels of other rows adjacent to the original row. This causes abnormality not only in the row in which a failure occurs in the row selection line, but also in other rows adjacent thereto. If abnormal output is generated in only one row by a failure of the row selection line, the output value of this row can be interpolated by pixel values of the rows adjacent thereto. When abnormal output occurs in a plurality of adjacent rows as described above, however, it becomes difficult to interpolate the output values of these rows.

For solving such a problem, shift registers may be provided at both ends of the row selection line. Even when a disconnection occurs at a certain point in the row selection line, such a configuration can supply the row selection signal from both sides of the point of failure, so as to enable the switch circuit of each pixel to operate favorably. However, modes of failure of the row selection line include short circuits to nearby lines in addition to the disconnection. In the case where the row selection line short-circuits to a nearby line at a certain point, the row selection line (in the vicinity of the point where the short circuit occurs) fails to attain a predetermined potential even when supplied with the row selection signal from the shift registers, so that the switch circuit cannot operate, whereby the charges keep accumulating in the photodiode. Therefore, the above-described problem still remains.

In view of the above problem, it is an object of the present invention to provide a solid-state imaging device which can read out charges from each pixel even when a row selection line fails.

Solution to Problem

In order to solve the above-described problem, the solid-state imaging device in accordance with the present invention comprises a photodetecting section having M×N pixels (each of M and N being an integer of 2 or more), each including one photodiode and first and second switch circuits each having one terminal connected to the one photodiode, two-dimensionally arrayed in M rows and N columns; N readout lines provided for the respective columns and connected to the other terminals of the first and second switch circuits included in the pixels of the corresponding columns; M first row selection lines provided for the respective rows and connected to control terminals of the first switch circuits included in the pixels of the corresponding rows; M first buffers having respective output terminals connected to the M first row selection lines; M second row selection lines provided for the respective rows and connected to control terminals of the second switch circuits included in the pixels of the corresponding rows; M second buffers having respective output terminals connected to the M second row selection lines; and a shift register section for generating a row selection signal for controlling an open/closed state of the first and second switch circuits for each row and providing input terminals of the first and second buffers with the common row selection signal; the shift register section having M signal output terminals provided one by one for the respective rows for outputting the row selection signal; the signal output terminals being connected to the input terminals of the first and second buffers of the corresponding rows.

In this solid-state imaging device, each pixel is provided with two switch circuits (first switch circuit and second switch circuit). These switch circuits are connected in parallel with each other between one photodiode and a readout line. Therefore, charges accumulated in the photodiode flow out to the readout line through the two switch circuits. The control terminals of the two switch circuits are connected to the respective row selection lines (first row selection line and second row selection line) different from each other. Since the shift register section provides these row selection lines with a common row selection signal, the two switch circuits perform opening/closing operations at the same timing.

Even when a failure such as disconnection or short circuit occurs in one row selection line of the first and second row selection lines, the above-described solid-state imaging device can provide each pixel with a row selection signal through the other row selection line, thereby making it possible for at least one switch circuit to operate favorably. Therefore, even when the row selection line fails, the charges can be read out from each pixel and inhibited from spilling over pixels of the other rows. In particular, since the above-described solid-state imaging device provides the first and second row selection lines with the respective buffers, even when one row selection line of the first and second row selection lines short-circuits to nearby lines, the other row selection line is not affected thereby and can transmit the row selection signal.

Advantageous Effects of Invention

The solid-state imaging device in accordance with the present invention can read out charges from each pixel even when a row selection line fails.

DESCRIPTION OF EMBODIMENTS

An embodiment of the solid-state imaging device in accordance with the present invention will be described below in detail with reference to the accompanying drawings. In the explanation of the drawings, the same elements will be denoted by the same reference signs, while omitting their overlapping descriptions.

Figure 1:
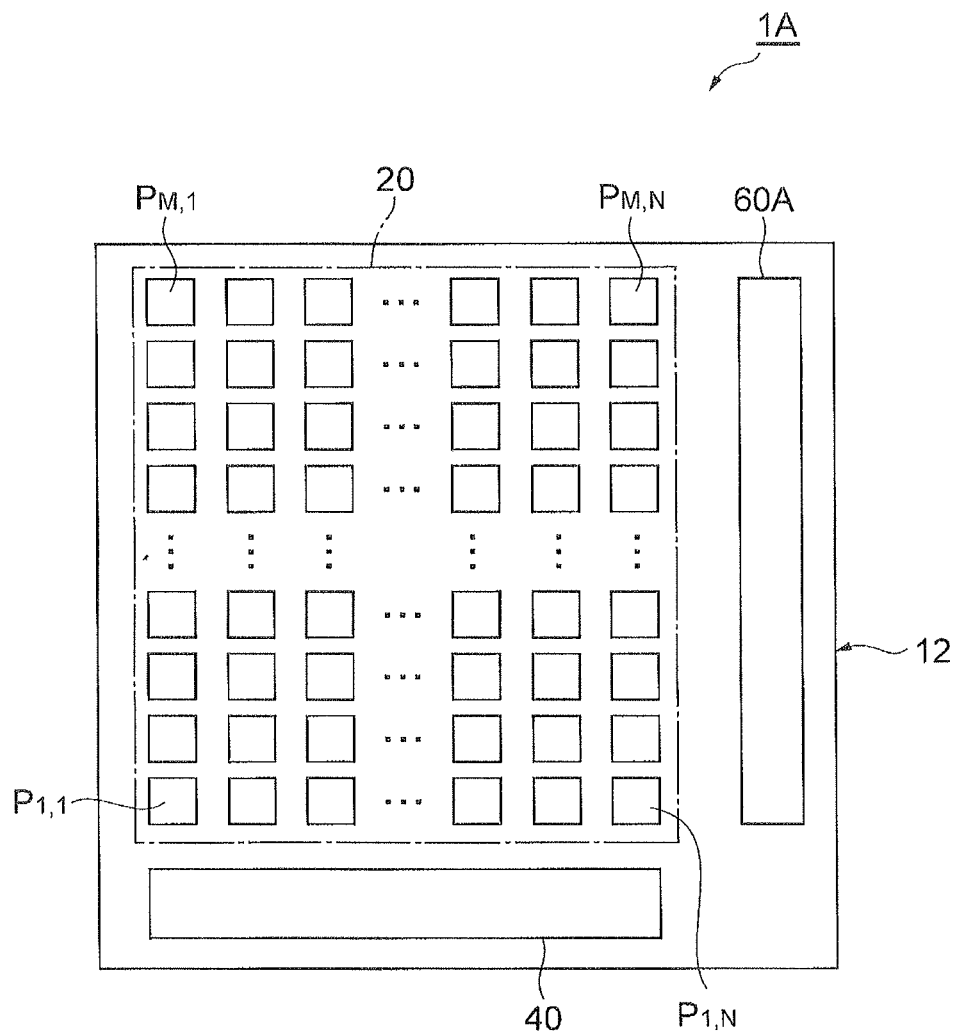
FIG. 1 is a plan view illustrating a configuration of a solid-state imaging device.
Figure 2:
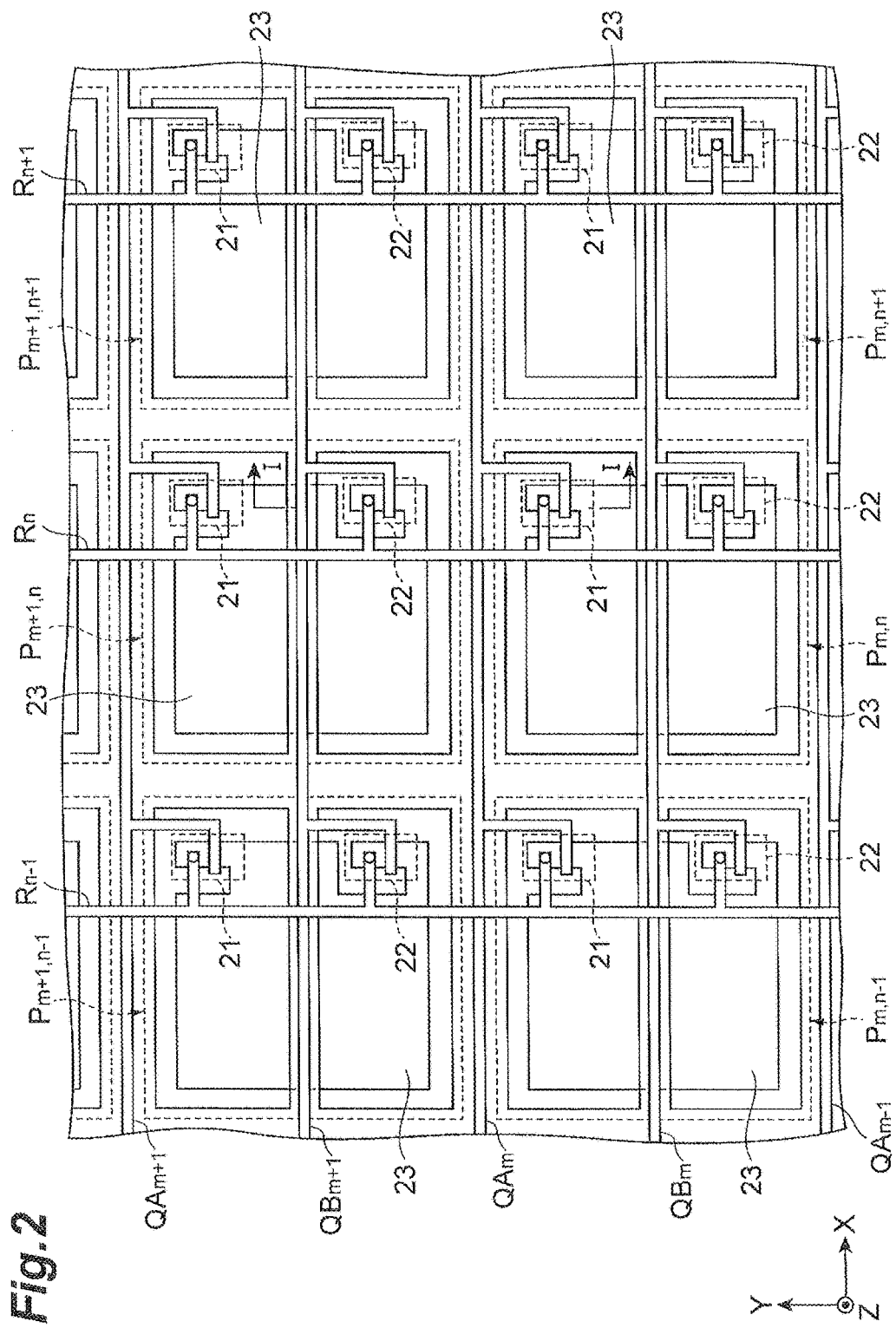
FIG. 2 is a plan view enlarging a part of the solid-state imaging device.

The solid-state imaging device in accordance with an embodiment is used for a medical X-ray imaging system, for example. FIG. 1 and FIG. 2 are diagrams illustrating a configuration of a solid-state imaging device 1A in this embodiment. FIG. 1 is a plan view illustrating the solid-state imaging device 1A, while FIG. 2 is a plan view enlarging a part of the solid-state imaging device 1A. FIG. 1 and FIG. 2 also depict an XYZ orthogonal coordinate system for easier understanding.

As illustrated in FIG. 1, the solid-state imaging device 1A comprises a photodetecting section 20, a readout circuit section 40, and a vertical shift register section 60A. The photodetecting section 20, readout circuit section 40, and vertical shift register section 60A are formed on a principal surface of a silicon substrate 12. The vertical shift register section 60A is juxtaposed with the photodetecting section 20 in the X-axis direction. The readout circuit section 40 includes a plurality of integration circuits provided so as to correspond to respective columns of the photodetecting section 20, while the integration circuits respectively generate voltage values corresponding to amounts of charges output from the pixels in the corresponding columns. The readout circuit section 40 holds the voltage values output from the respective integration circuits and sequentially outputs the held voltage values.

The photodetecting section 20 is constructed by two-dimensionally arranging a plurality of pixels $P_{1,1}$ to $P_{M,N}$ over M rows and N columns (where each of M and N is an integer of 2 or more). FIG. 2 depicts six pixels $P_{m,n-1}$, $P_{m,n}$, $P_{m,n+1}$, $P_{m+1,n-1}$, $P_{m+1,n}$, and $P_{m+1,n+1}$ as representative of the plurality of pixels $P_{1,1}$ to $P_{M,N}$. For example, the pixel $P_{m,n}$ is the one located on the m-th row and the n-th column (where m is an integer of 1 or more and M or less, and n is an integer of 1 or more and N or less). In FIG. 1 and FIG. 2, the column direction coincides with the Y-axis direction, and the row direction coincides with the X-axis directions.

Each of the pixels $P_{1,1}$ to $P_{M,N}$ included in the photodetecting section 20 is constructed so as to include transistors 21, 22 and one photodiode 23. The transistors 21, 22 are first and second switch circuits, respectively, in this embodiment. The transistors 21, 22 are preferably constituted by field-effect transistors (FETs) but may also be constituted by bipolar transistors. The following explanation will assume the transistors 21 and 22 to be FETs. In this case, by control terminal is meant a gate. When the transistors 21, 22 are bipolar transistors, by control terminal is meant a base.

The photodiode 23 generates charges by an amount corresponding to the intensity of light incident thereon and accumulates thus generated charges in a junction capacitance part. The transistors 21, 22 have respective one terminals (e.g., their source regions) electrically connected to the photodiode 23. A scintillator, which is not depicted, is disposed on the photodetecting section 20. The scintillator generates scintillation light according to X-rays incident thereon, converts an X-ray image into a light image, and outputs the light image to the photodiode 23.

The solid-state imaging device 1A further comprises M first row selection lines $QA_1$ to $QA_M$ (represented by $QA_m$ and $QA_{m+1}$ in FIG. 2) provided for the respective rows, M second row selection lines $QB_1$ to $QB_M$ (represented by $QB_m$ and $QB_{m+1}$ in FIG. 2) provided for the respective rows, and a plurality of readout lines $R_1$ to $R_N$ (represented by $R_{n-1}$, $R_n$, and $R_{n+1}$ in FIG. 2).

The first row selection line $QA_m$ at the m-th row electrically connects the control terminals (e.g., gate terminals) for controlling the open/closed state of the transistors 21 included in the pixels $P_{m,1}$ to $P_{m,N}$ of the corresponding row to the vertical shift register section 60A. The second row selection line $QB_m$ at the m-th row electrically connects the control terminals (e.g., gate terminals) for controlling the open/closed state of the transistors 22 included in the pixels $P_{m,1}$ to $P_{m,N}$ of the corresponding row to the vertical shift register section 60A.

The vertical shift register section 60A generates a row selection signal for controlling the open/closed state of the transistors 21, 22 for each row and provides a common row selection signal for the row selection lines $QA_m$, $QB_m$ at the m-th row. The readout line $R_n$ at the n-th column is electrically connected to the other terminals of the transistors 21, 22 (e.g., their drain regions) included in the pixels $P_{1,n}$ to $P_{M,n}$ of the corresponding column. The row selection lines $QA_1$ to $QA_M$, $QB_1$ to $QB_M$ and readout lines $R_1$ to $R_N$ are made of a metal, for example.

Figure 3:
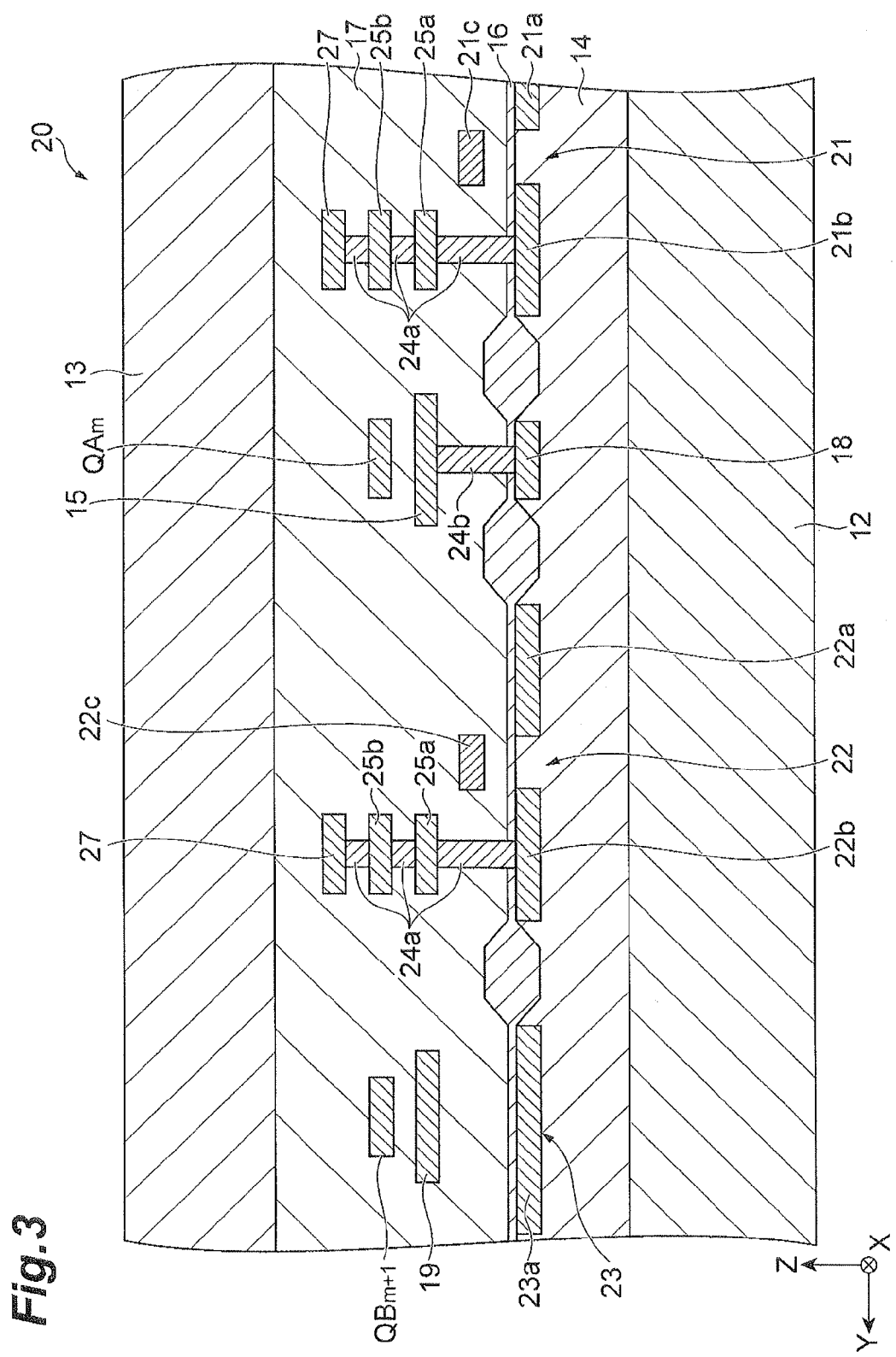
FIG. 3 is a side sectional view illustrating a cross section taken along the line I-I in FIG. 2.

FIG. 3, which is a side sectional view illustrating a cross section taken along the line I-I of FIG. 2, depicts a cross-sectional structure of the photodetecting section 20 under magnification. As illustrated in FIG. 3, a p-type well layer 14 is provided all over a principal surface of the silicon substrate 12. The p-type well layer 14 is formed by injecting p-type impurities into the principal surface of the silicon substrate 12, for example. The transistors 21, 22 and photodiode 23 are formed on the surface of the p-type well layer 14.

The photodiode 23 is preferably constructed by a high-concentration n-type region 23a formed near a surface layer of the p-type well layer 14. That is, the photodiode 23 generates charges in the high-concentration n-type region 23a by an amount corresponding to the intensity of light incident thereon and accumulates the generated charges in a junction capacitance part between the high-concentration n-type region 23a and p-type well layer 14.

The transistor 21 has a source region 21a and a drain region 21b which are made of a high-concentration n-type semiconductor. The source region 21a is formed integrally with the high-concentration n-type region 23a of the photodiode 23. A gate electrode 21c is provided on the p-type well layer 14 between the source region 21a and drain region 21b, while an insulating film 16 is interposed between the gate electrode 21c and p-type well layer 14.

A branch part 27 of the readout line $R_1$ to $R_N$ is disposed on the drain region 21b of the transistor 21 with a metal conductor 24a and metal layers 25a, 25b interposed therebetween. The drain region 21b is electrically connected to the readout line $R_1$ to $R_N$ of its corresponding column through the metal conductor 24a, metal layers 25a, 25b, and branch part 27.

The gate electrode 21c of the transistor 21 is electrically connected to the row selection line $QA_1$ to $QA_M$ of its corresponding row. Each of the row selection lines $QA_1$ to $QA_M$, which are disposed in regions between the pixels adjacent to each other, is placed on a pixel separation region 18 provided between the pixels adjacent to each other in this embodiment, for example. The pixel separation region 18 is made of a high-concentration p-type semiconductor, for example.

A reference potential line 15 is provided in a layer between the row selection line $QA_1$ to $QA_M$ and the pixel separation region 18, while the reference potential line 15 is held at a reference potential (ground potential). In other words, the row selection line $QA_m$ and reference potential line 15 are arranged in this order as seen in the radiation incident direction. The reference potential line 15 and pixel separation region 18 are electrically connected to each other through a metal conductor 24b. Preferably, the lateral width of the reference potential line 15 as seen in the thickness direction of the silicon substrate 12 is larger than the width of the row selection line $QA_1$ to $QA_M$ in the same direction.

The transistor 22 has a source region 22a and a drain region 22b which are made of a high-concentration n-type semiconductor. The source region 22a is formed integrally with the high-concentration n-type region 23a of the photodiode 23. A gate electrode 22c is provided on the p-type well layer 14 between the source region 22a and drain region 22b, while the insulating film 16 is interposed between the gate electrode 22c and p-type well layer 14.

A branch part 27 of the readout line $R_1$ to $R_N$ is disposed on the drain region 22b of the transistor 22 with a metal conductor 24a and metal layers 25a, 25b interposed therebetween. The drain region 22b is electrically connected to the readout line $R_1$ to $R_N$ of its corresponding column through the metal conductor 24a, metal layers 25a, 25b, and branch part 27.

The gate electrode 22c of the transistor 22 is electrically connected to the row selection line $QB_1$ to $QB_M$ of its corresponding row. The row selection lines $QB_1$ to $QB_M$ are disposed on the pixels; for example, the row selection line $QB_m$ at the m-th row is disposed on the high-concentration n-type regions 23a of the photodiodes 23 included in the pixels $P_{m,1}$ to $P_{m,N}$ of the corresponding row. A reference potential line 19 is provided in a layer between the row selection line $QB_1$ to $QB_M$ and the high-concentration n-type region 23a, while the reference potential line 19 is held at a reference potential (ground potential). In other words, the row selection line $QB_m$ and reference potential line 19 are arranged in this order as seen in the radiation incident direction. Preferably, the lateral width of the reference potential line 19 as seen in the thickness direction of the silicon substrate 12 is larger than the width of the row selection line $QB_1$ to $QB_M$ in the same direction.

The above-described lines are covered with an insulating layer 17. A scintillator 13 is provided on the insulating layer 17 so as to cover the whole surface of the silicon substrate 12. The scintillator 13 generates scintillation light according to X-rays incident thereon, converts an X-ray image into a light image, and outputs the light image to the photodiodes 23.

Figure 4:
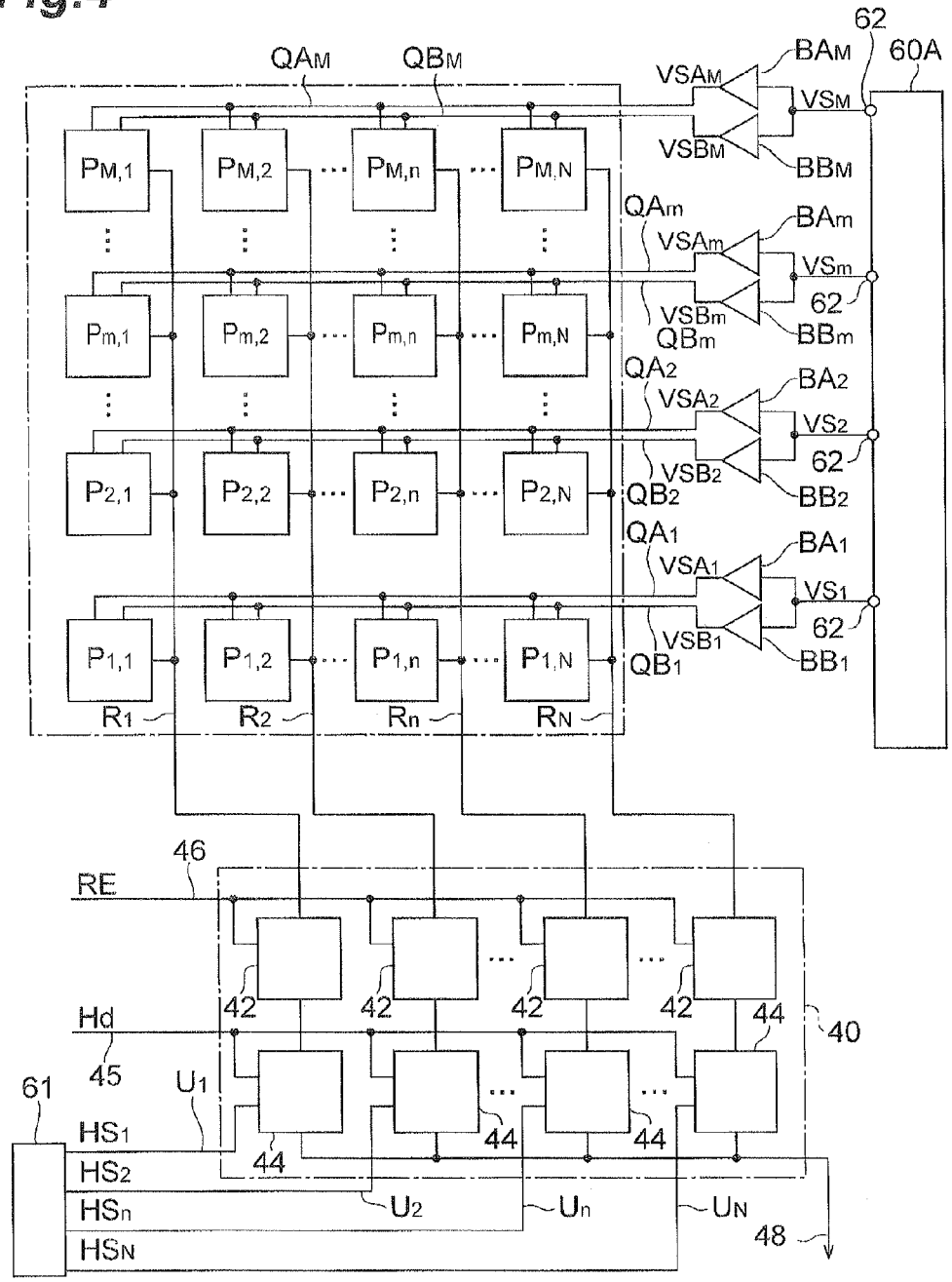
FIG. 4 is a diagram illustrating an inner configuration of the solid-state imaging device.

A circuit configuration of the solid-state imaging device 1A will now be explained in detail. FIG. 4 is a diagram illustrating an inner configuration of the solid-state imaging device 1A. As depicted, the solid-state imaging device 1A comprises M first buffers $BA_1$ to $BA_M$ having respective output terminals connected to the M first row selection lines $QA_1$ to $QA_M$ and M second buffers $BB_1$ to $BB_M$ having respective output terminals connected to the M second row selection lines $QB_1$ to $QB_M$. The vertical shift register section 60A generates row selection signals $VS_1$ to $VS_M$ for controlling the open/closed state of the transistors 21, 22 (see FIG. 2) of the pixels $P_{1,1}$ to $P_{M,N}$ for the respective rows. The row selection signals $VS_1$ to $VS_M$ are common signals for the transistors 21, 22.

The vertical shift register section 60A has M signal output terminals 62 provided one by one for the respective rows in order to output the row selection signals $VS_1$ to $VS_M$, while the signal output terminals 62 are respectively connected to the input terminals of the buffers $BA_1$ to $BA_M$ and $BB_1$ to $BB_M$ at their corresponding rows. The vertical shift register section 60A provides the input terminals of the first buffer $BA_m$ and second buffer $BB_m$ with the row selection signal $VS_m$ for the m-th row. The first buffer $BA_m$ outputs a row selection signal $VSA_m$ based on the row selection signal $VS_m$. The second buffer $BB_m$ outputs a row selection signal $VSB_m$ based on the row selection signal $VS_m$. The row selection signals $VS_1$ to $VS_M$ sequentially become significant values in the vertical shift register section 60A.

The readout circuit section 40 has N integration circuits 42 and N holding circuits 44 provided for the respective columns. The integration circuits 42 and holding circuits 44 are connected to each other in series for each column. The N integration circuits 42 have respective input terminals connected to the readout lines $R_1$ to $R_N$, accumulate the charges input from the readout lines $R_1$ to $R_N$, and output respective voltage values corresponding to the amounts of accumulated charges from their output terminals to the N holding circuits 44. The N integration circuits 42 are also connected to a reset line 46 provided in common for the N integration circuit 42.

The N holding circuits 44 have respective input terminals connected to the output terminals of the integration circuits 42, hold the voltage values input to the input terminals, and output the held voltage values from the output terminals to a voltage output line 48. The N holding circuits 44 are connected to a hold line 45 provided in common for the N holding circuits 44. The N holding circuits 44 are also connected to a horizontal shift register section 61 through a first column selection line $U_1$ to an N-th column selection line $U_N$.

The horizontal shift register section 61 provides the N holding circuits 44 with column selection signals $HS_1$ to $HS_N$ through the column selection lines $U_1$ to $U_N$, respectively. The column selection signals $HS_1$ to $HS_N$ sequentially become significant values. Each of the N integration circuits 42 is provided with a reset control signal RE through the reset line 46. Each of the N holding circuits 44 is provided with a hold control signal Hd through the hold line 45.

Figure 5:
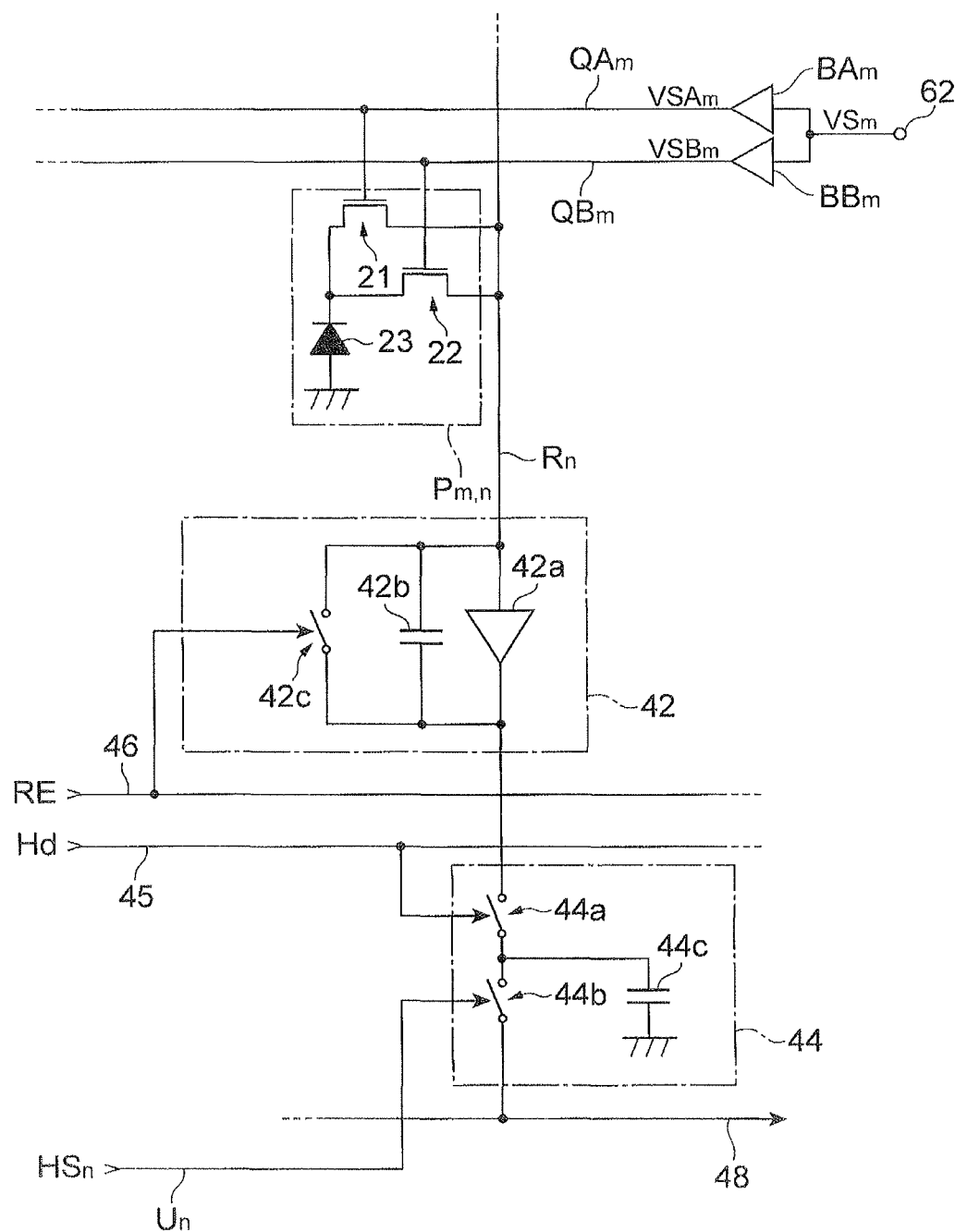
FIG. 5 is a diagram illustrating a detailed circuit configuration example of a pixel, an integration circuit, and a holding circuit.

FIG. 5 is a diagram illustrating a detailed circuit configuration example of the pixel $P_{m,n}$, integration circuit 42, and holding circuit 44. As a representative of the M×N pixels $P_{1,1}$ to $P_{M,N}$, a circuit diagram of the pixel $P_{m,n}$ on the m-th row and the n-th column is illustrated here.

As illustrated in FIG. 5, the photodiode 23 of the pixel $P_{m,n}$ has a grounded anode terminal and a cathode terminal connected to the readout line $R_n$ through the transistors 21, 22. The transistor 21 of the pixel $P_{m,n}$ is provided with the selection signal $VSA_m$ from the first buffer $BA_m$ through the first selection line $QA_m$. The selection signal $VSA_m$ instructs the transistors 21 included in the N pixels $P_{m,1}$ to $P_{m,N}$ of the m-th row to open/close. The transistor 22 of the pixel $P_{m,n}$ is provided with the selection signal $VSB_m$ from the second buffer $BB_m$ through the second selection line $QB_m$. The selection signal $VSB_m$ instructs the transistors 22 included in the N pixels $P_{m,1}$ to $P_{m,N}$ of the m-th row to open/close.

When the selection signals $VSA_m$, $VSB_m$ are non-significant values (off-voltages for the control terminals of the transistors 21, 22), the charges generated in the photodiode 23 are accumulated in the junction capacitance part of the photodiode 23 without being output to the readout line $R_n$. When the selection signals $VSA_m$, $VSB_m$ are significant values (on-voltages for the control terminals of the transistors 21, 22), on the other hand, the transistors 21, 22 are in a connected state. At this time, the charges accumulated in the junction capacitance part of the photodiode 23 are output to the readout line $R_n$ through the transistors 21, 22. The charges output from the photodiode 23 of the pixel $P_{m,n}$ are sent to the integration circuit 42 through the readout line $R_n$. Since the selection signals $VSA_m$, $VSB_m$ are generated from the common selection signal $VS_m$, their non-significant value and significant value are switched at timings identical to each other.

The integration circuit 42 has a so-called charge integration type configuration including an amplifier 42a, a capacitive element 42b, and a discharge switch 42c. The capacitive element 42b and discharge switch 42c are connected in parallel with each other between the input terminal and output terminal of the amplifier 42a. The amplifier 42a has an input terminal connected to the readout line $R_n$. The discharge switch 42c is provided with the reset control signal RE through the reset line 46.

The reset control signal RE instructs the respective discharge switches 42c of the N integration circuits 42 to open/close. For example, when the reset control signal RE is a non-significant value (e.g., high level), the discharge switch 42c closes, so as to discharge the capacitive element 42b, thereby initializing the output voltage value of the integration circuit 42. When the reset control signal RE is a significant value (e.g., low level), the discharge switch 42c opens, so that the charges input to the integration circuit 42 are accumulated in the capacitive element 42b, whereby a voltage value corresponding to the amount of accumulated charges is output from the integration circuit 42.

The holding circuit 44 includes an input switch 44a, an output switch 44b, and a capacitive element 44c. One end of the capacitive element 44c is grounded. The other end of the capacitive element 44c is connected to the output terminal of the integration circuit 42 through the input switch 44a and to the voltage output line 48 through the output switch 44b. The input switch 44a is provided with the hold control signal Hd through the hold line 45. The hold control signal Hd instructs the respective input switches 44a of the N holding circuits 44 to open/close. The output switch 44b of the holding circuit 44 is provided with the n-th column selection signal $HS_n$ through the n-th column selection line $U_n$. The selection signal $HS_n$ instructs the output switch 44b of the holding circuit 44 to open/close.

When the hold control signal Hd changes from the high level to the low level, for example, the input switch 44a changes from the closed state to the open state, whereupon the voltage value input to the holding circuit 44 is held by the capacitive element 44c. When the n-th column selection signal $HS_n$ changes from the low level to the high level, the output switch 44b is closed, whereupon the voltage value held by the capacitive element 44c is output to the voltage output line 48.

Figure 6:
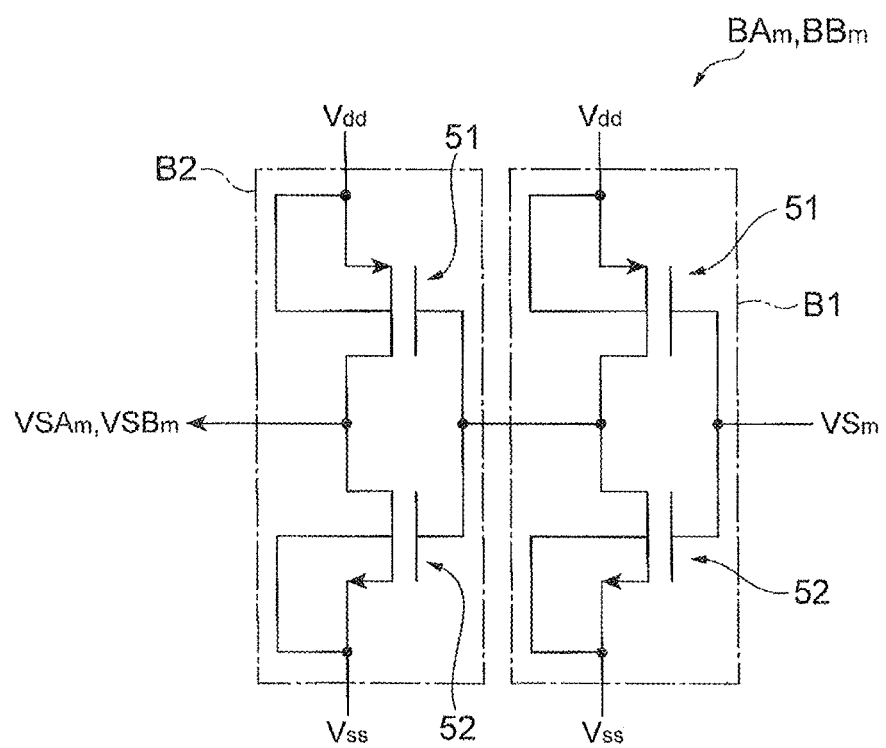
FIG. 6 is a circuit diagram illustrating an inner configuration example of buffers.

FIG. 6 is a circuit diagram illustrating an inner configuration example of buffers $BA_m$, $BB_m$. The buffers $BA_m$, $BB_m$, are impedance converters which output their input signals with low impedance and generate output signals (selection signals $VSA_m$, $VSB_m$) corresponding to their received power supply voltage regardless of the magnitude of the input signal (selection signal $VS_m$). For example, the buffers $BA_m$, $BB_m$ illustrated in FIG. 6 include two-stage amplifier circuits B1, B2, each of which is constituted by a CMOS inverter.

Specifically, each of the amplifier circuits B1, B2 is constructed so as to include two MOSFETs (p-MOSFET 51 and n-MOSFET 52). The drain terminal of the p-MOSFET 51 and the drain terminal of the n-MOSFET 52 are connected to each other, the source terminal of the p-MOSFET 51 is connected to a positive power supply potential Vdd, and the source terminal of the n-MOSFET 52 is connected to a negative power supply potential Vss. The selection signal $VS_m$ is input to the gate terminals of the p-MOSFET 51 and n-MOSFET 52 in the amplifier circuit B1. The drain terminals of the p-MOSFET 51 and n-MOSFET 52 in the amplifier circuit B1 are connected to the gate terminals of the p-MOSFET 51 and n-MOSFET 52 in the amplifier circuit B2. A signal from the drain terminals of the p-MOSFET 51 and n-MOSFET 52 in the amplifier circuit B2 is output as the selection signal $VSA_m$, $VSB_m$.

Both capacitance and resistance are large in the first row selection lines $QA_1$ to $QA_M$ and second row selection lines $QB_1$ to $QB_M$. Therefore, for switching voltage values of the selection signals $VSA_m$, $VSB_m$ within a predetermined time, it is desirable for the buffers $BA_m$, $BB_m$ to be able to output large currents. Since CMOS inverters such as those described above have low output impedance, employing CMOS inverters in the amplifier circuits B1, B2 can favorably achieve the buffers $BA_m$, $BB_m$ capable of outputting large currents.

Figure 7:
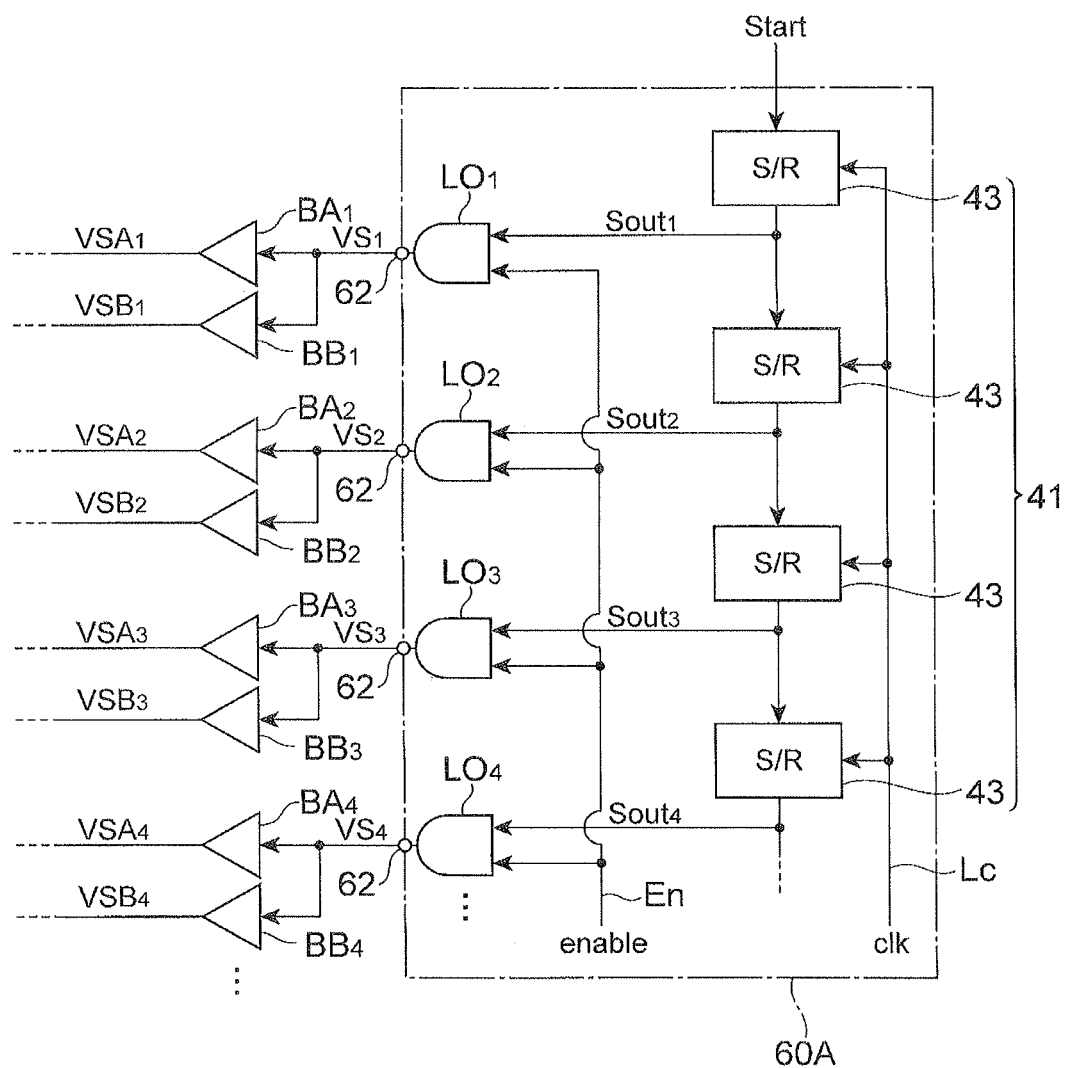
FIG. 7 is a circuit diagram illustrating a detailed configuration of a vertical shift register section.

FIG. 7 is a circuit diagram illustrating a detailed configuration of the vertical shift register section 60A in this embodiment. As illustrated in FIG. 7, the vertical shift register section 60A has a shift register array 41 and M logic circuits $LO_1$ to $LO_M$ (represented by $LO_1$ to $LO_4$ in the diagram).

The shift register array 41 is constructed by connecting M shift register circuits 43 in series. The shift register circuits 43 are arranged one by one for the respective rows. The shift register circuits 43 are constituted by a plurality of FETs having configurations similar to those of the transistors 21, 22 illustrated in FIG. 3, for example. A clock line Le is connected to the shift register circuits 43, whereby a clock signal clk having a fixed period is supplied from the clock line Lc to each shift register circuit 43.

The M logic circuits $LO_1$ to $LO_M$ are arranged so as to correspond to the respective rows, while the output terminal of the logic circuit $LO_m$ at the m-th row is connected to the input terminals of the above-described buffers $BA_m$, $BB_m$ through the signal output terminal 62 provided for each row. An enable line En is connected to respective one input terminals of the logic circuits $LO_1$ to $LO_M$, whereby a control input signal enable is supplied from the enable line En to the logic circuits $LO_1$ to $LO_M$. Connected to the respective other input terminals of the logic circuits $LO_1$ to $LO_M$ are output terminals of the shift register circuits 43 corresponding to their rows.

The M logic circuits $LO_1$ to $LO_M$ output the respective row selection signals $VS_1$ to $VS_M$ so as to close the transistors 21, 22 when both of the control input signal enable and output signals $Sout_1$ to $Sout_M$ from their corresponding shift register circuits 43 are significant values. When the significant value of the control input signal enable is high level and the significant value of the output signals $Sout_1$ to $Sout_M$ from the shift register circuits 43 are high levels, for example, the logic circuit $LO_m$ at the m-th row outputs a logical conjunction (AND) of the control input signal enable and the output signal $Sout_m$ from the shift register circuit 43. The logic circuits $LO_1$ to $LO_M$ are illustrated by symbols representing AND circuits in FIG. 7, but may be constructed by combinations of various other logic circuits.

Figure 8:
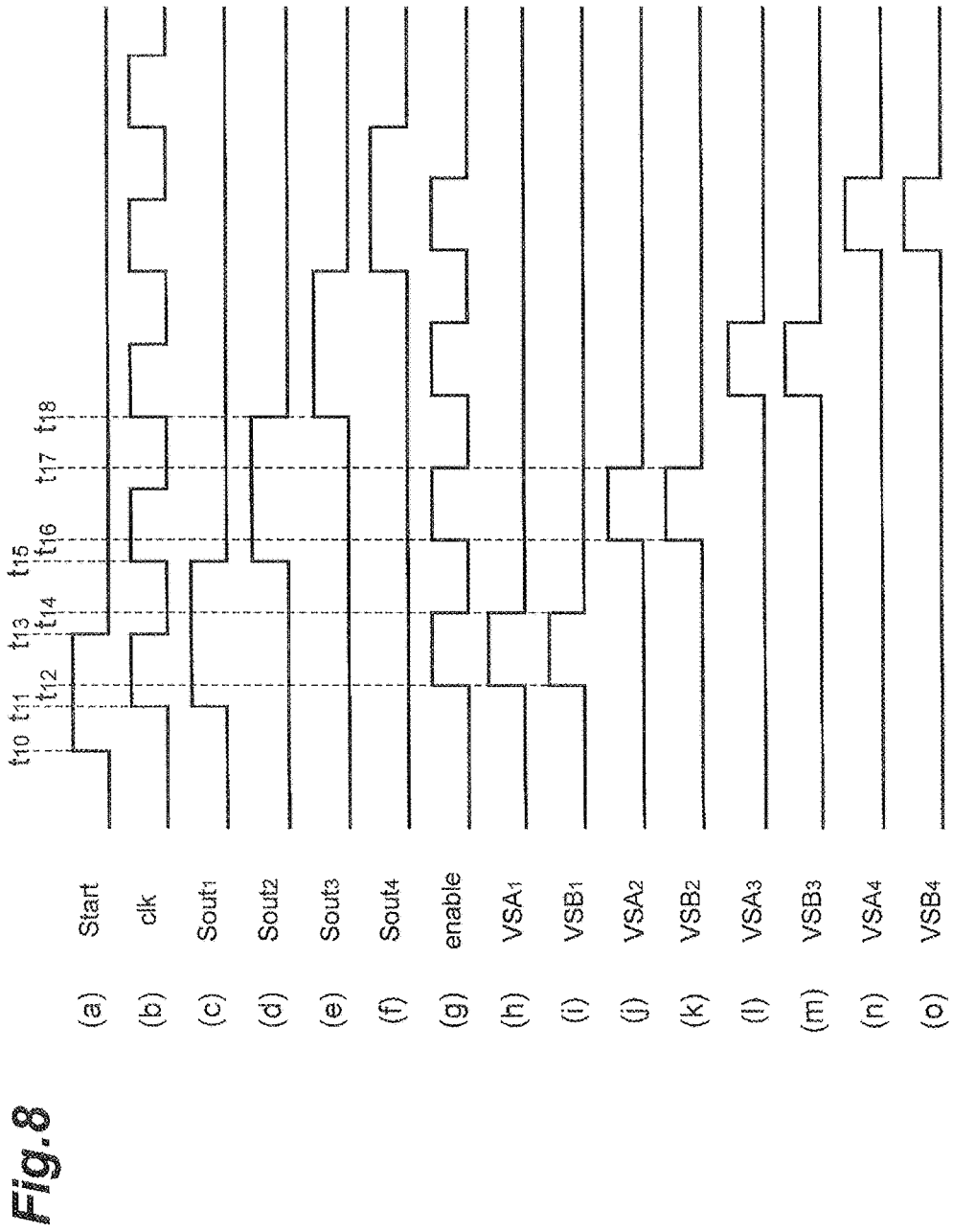
FIG. 8 is a timing chart illustrating operations of the vertical shift register section.

FIG. 8 is a timing chart illustrating operations of the vertical shift register section 60A in this embodiment. FIG. 8 illustrates, successively from the upper side, (a) start signal Start, (b) clock signal clk, (c) output signal $Sout_1$ from the shift register circuit 43 at the first row, (d) output signal $Sout_2$ from the shift register circuit 43 at the second row, (e) output signal $Sout_3$ from the shift register circuit 43 at the third row, (f) output signal $Sout_4$ from the shift register circuit 43 at the fourth row, (g) control input signal enable, (h) first row selection signal $VSA_1$, (i) first row selection signal $VSB_1$, (j) second row selection signal $VSA_2$, (k) second row selection signal $VSB_2$, (l) third row selection signal $VSA_3$, (m) third row selection signal $VSB_3$, (n) fourth row selection signal $VSA_4$, and (o) fourth row selection signal $VSB_4$.

First, the start signal Start is set to the high level in a period from time $t_{10}$ to time $t_{13}$. When the clock signal clk rises during this period, the output signal $Sout_1$ from the shift register circuit 43 at the first row rises (time $t_{11}$). The output signal $Sout_1$ falls as the next clock signal clk rises (time $t_{15}$). The control input signal enable is set to the high level during a predetermined period (time $t_{12}$ to $t_{14}$) included in the duration from time $t_{11}$ to time $t_{15}$ when the output signal $Sout_1$ is the high level. This causes the first row selection signals $VSA_1$, $VSB_1$ to have the high levels, thereby turning on the transistors 21, 22 included in the respective pixels $P_{1,1}$ to $P_{1,N}$ at the first row.

Concurrently with the falling of the output signal $Sout_1$ from the shift register circuit 43 at the first row, the output signal $Sout_2$ from the shift register circuit 43 at the second row rises (time $t_{15}$). The output signal $Sout_2$ falls as the next clock signal clk rises (time $t_{18}$). The control input signal enable is set to the high level again during a predetermined period (time $t_{16}$ to $t_{17}$) included in the duration from time $t_{15}$ to time $t_{18}$ when the output signal $Sout_2$ is the high level. This causes the second row selection signals $VSA_2$, $VSB_2$ to have the high levels, thereby turning on the transistors 21, 22 included in the respective pixels $P_{2,1}$ to $P_{2,N}$ at the second row. Subsequently, operations similar to that at the second row cause the selection signals $VSA_m$, $VSB_m$ at the third and later rows to become high levels in sequence, thereby successively turning on the transistors 21, 22 included in each pixel for the respective rows.

Figure 9:
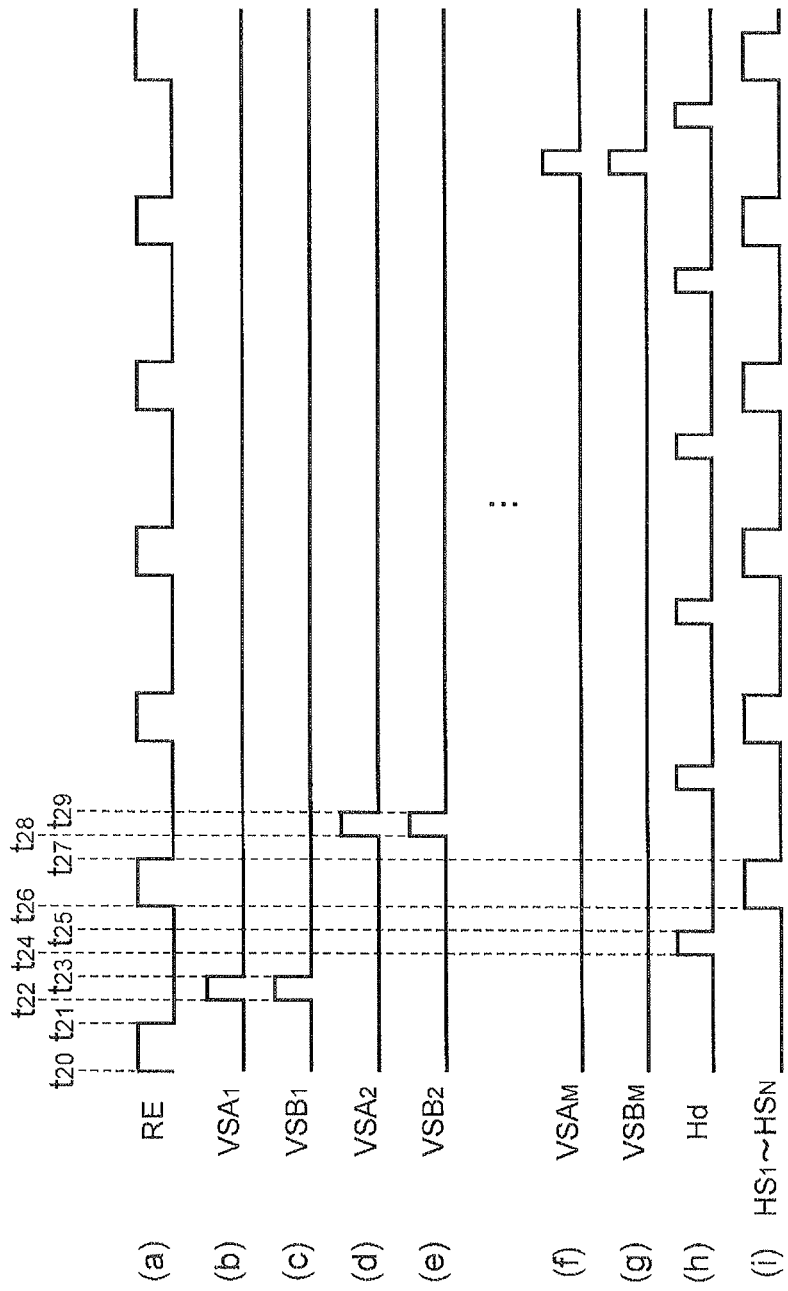
FIG. 9 is a timing chart of respective signals.

Thus constructed solid-state imaging device 1A of this embodiment operates as follows. FIG. 9 is a timing chart of respective signals. FIG. 9 illustrates, successively from the upper side, (a) reset control signal RE, (b) first row selection signal $VSA_1$, (c) first row selection signal $VSB_1$, (d) second row selection signal $VSA_2$, (e) second row selection signal $VSB_2$, (f) M-th row selection signal $VSA_M$, (g) M-th row selection signal $VSB_M$, (h) hold control signal Hd, and (i) first column selection signal $HS_1$ to N-th column selection signal $HS_N$.

First, the reset control signal RE is set to the high level during a period from time $t_{20}$ to time $t_{21}$ as illustrated in FIG. 9. This closes the discharge switches 42c in the N integration circuits 42, thereby discharging the capacitive elements 42b.

During a period from time $t_{22}$ after time $t_{21}$ to time $t_{23}$, the operations illustrated in FIG. 8 set the first row selection signals $VSA_1$, $VSB_1$ to the high levels. This turns the transistors 21, 22 into the connected states in the pixels $P_{1,1}$ to $P_{1,N}$ at the first row, whereby the charges accumulated in the photodiodes 23 of the pixels $P_{1,1}$ to $P_{1,N}$ are output to the integration circuits 42 throughout the readout lines $R_1$ to $R_N$, so as to accumulate in the capacitive elements 42b. Each integration circuit 42 outputs a voltage value having a magnitude corresponding to the amount of charges accumulated in the capacitive element 42b. After time $t_{23}$, the transistors 21, 22 in each of the pixels $P_{1,1}$ to $P_{1,N}$ at the first row are turned into unconnected states.

During a period from time $t_{24}$ after time $t_{23}$ to time $t_{25}$, the hold control signal Hd is set to the high level, which turns the input switch 44a into the connected state in each of the N holding circuits 44, whereby the voltage value output from the integration circuit 42 is held by the capacitive element 44c.

Next, during a period from time $t_{26}$ after time $t_{25}$ to time $t_{27}$, the horizontal shift register section 61 turns the first column selection signal $HS_1$ to N-th column selection signal $HS_N$ into the high levels in sequence. This successively closes the output switches 44b of the N holding circuits 44, whereby the voltage values held by the capacitive elements 44c are sequentially output to the voltage output line 48. During this period, the reset control signal RE is set to the high level, whereby the capacitive element 42b of each integration circuit 42 is discharged.

Thereafter, during a period from time $t_{28}$ after time $t_{27}$ to time $t_{29}$, the second row selection signals $VSA_2$, $VSB_2$ are set to the high levels. This turns the transistors 21, 22 into connected states in the pixels $P_{2,1}$ to $P_{2,N}$ at the second row, whereby the charges accumulated in the photodiodes 23 of the pixels $P_{2,1}$ to $P_{2,N}$ are output to the integration circuits 42 through the readout lines $R_1$ to $R_N$, so as to be accumulated in the capacitive elements 42b.

Subsequently, an operation similar to that at the first row successively outputs the voltage values having magnitudes corresponding to the amounts of charges accumulated in the capacitive elements 42b from the N holding circuits 44 to the voltage output line 48. Operations similar to that at the first row also convert the charges accumulated in the pixels at the third to M-th rows into voltage values and successively output them to the voltage output line 48. This completes the readout of image data by one image frame from the photodetecting section 20.

Effects obtained by the solid-state imaging device 1A of this embodiment explained in the foregoing will now be explained. As described above, the operation of reading out charges from each of the pixels $P_{1,1}$ to $P_{M,N}$ also serves as a reset operation for getting ready for accumulating charges in the next frame. When a failure such as short circuit occurs in a row selection line in a conventional solid-state imaging device, however, a row selection signal fails to reach pixels beyond the point of failure, whereby a switch circuit does not operate. In this case, the charges in the pixel keep accumulating in the photodiode and spill over pixels of other rows adjacent to the original row. This causes abnormality not only in the row in which a failure occurs in the row selection line, but also in other rows adjacent thereto. In particular, when the solid-state imaging device has such a multilayer structure of metal lines as illustrated in FIG. 3, i.e., a structure in which a first layer for forming a reference potential line, a second layer for forming a row selection line, and a third layer for forming a readout line are stacked, the reference potential line of the first layer and the row selection line of the second layer may short-circuit to each other.

For the problem described above, the solid-state imaging device 1A provides each of the pixels $P_{1,1}$ to $P_{M,N}$ with two switch circuits (transistors 21, 22). The transistors 21, 22 in each of the pixels $P_{1,n}$ to $P_{M,n}$ at the n-th column are connected in parallel with each other between the photodiode 23 and the readout line $R_n$. Therefore, the charges accumulated in the photodiode 23 flow out to the readout line $R_n$ through the transistors 21, 22. The control terminals of the transistors 21, 22 in the pixels $P_{m,1}$ to $P_{m,N}$ at the m-th row are connected to the row selection lines $QA_m$, $QB_m$ separate from each other. The row selection lines $QA_m$, $QB_m$ are provided with the common row selection signals $VSA_m$, $VSB_m$, respectively, from the vertical shift register section 60A, whereby the transistors 21, 22 open/close at the same timing.

Even when a failure such as disconnection or short circuit occurs in one of the row selection lines $QA_m$, $QB_m$, the solid-state imaging device 1A can provide each of the pixels $P_{m,1}$ to $P_{m,N}$ with the row selection signal $VSA_m$ or $VSB_m$ through the other row selection line, thereby making it possible for at least one of the transistors 21, 22 to operate favorably. Therefore, even when one of the row selection lines $QA_m$, $QB_m$ fails, the charges can be read out from each of the pixels $P_{m,1}$ to $P_{m,N}$ and effectively inhibited from spilling over pixels of the other rows adjacent thereto.

In particular, since the solid-state imaging device 1A of this embodiment provides the row selection lines $QA_m$, $QB_m$ with the respective buffers $BA_m$, $BB_m$, even when one of the row selection lines $QA_m$, $QB_m$ short-circuits to nearby lines, the other row selection line is not affected thereby and can transmit the row selection signal $VSA_m$ or $VSB_m$. The probability of both the row selection lines $QA_m$, $QB_m$ short-circuiting at the same time is so low that it is hardly problematic.

As illustrated in FIG. 2 and FIG. 3, the row selection lines $QA_m$, $QB_m$ may be arranged such that one row selection line $QA_m$ is disposed in a region between the pixels while the other row selection line $QB_m$ is disposed on the pixels $P_{m,1}$ to $P_{m,N}$. This can place the row selection lines $QA_m$, $QB_m$ such that they are separated from each other, thereby enhancing the yield at the time of manufacturing the solid-state imaging device 1A. This can also form the row selection lines $QA_m$, $QB_m$ within the same layer unlike a fourth modified example which will be explained later.

When one row selection line $QA_m$ is disposed in a region between the pixels and the other row selection line $QB_m$ is disposed on the pixels $P_{m,1}$ to $P_{m,N}$ as described above, it is desirable to provide the reference potential line 19 between the other row selection line $QB_m$ and the pixels $P_{m,1}$ to $P_{m,N}$ as in this embodiment in order to suppress the fluctuation of the amount of charges in the photodiode 23 caused by the voltage change in the other row selection line $QB_m$. Since each pixel is partly covered with the row selection line $QB_m$, the aperture ratio slightly decreases in this embodiment. When the pixel size is a square of 100 μm or larger, for example, the decrease in aperture ratio is only about 3%, which is hardly problematic.

First Modified Example

Figure 10:
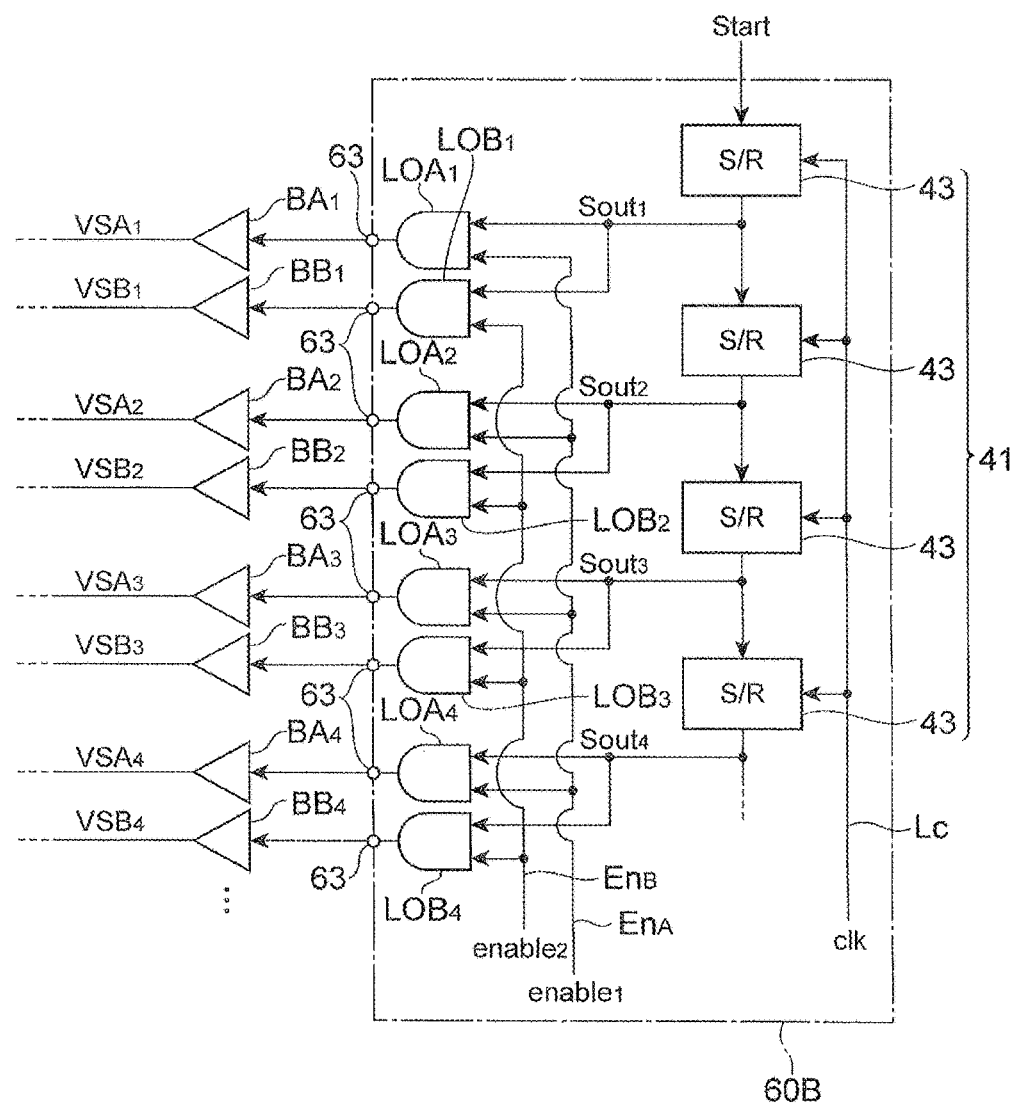
FIG. 10 is a circuit diagram illustrating a detailed configuration of a vertical shift register section as a first modified example.

FIG. 10 is a circuit diagram illustrating a detailed configuration of a vertical shift register section 60B as a first modified example of the above-described embodiment. As illustrated in FIG. 10, the vertical shift register section 60B has a shift register array 41, M logic circuits $LOA_1$ to $LOA_M$ (represented by $LOA_1$ to $LOA_4$ in the diagram) and M logic circuits $LOB_1$ to $LOB_M$ (represented by $LOB_1$ to $LOB_4$ in the diagram). The shift register array 41 is constructed as in the above-described embodiment.

The M logic circuits $LOA_1$ to $LOA_M$ are arranged so as to correspond to the respective rows, while the output terminal of the logic circuit $LOA_m$ at the m-th row is connected to the input terminal of the buffer $BA_m$ through one of two signal output terminals 63 provided for each row. The M logic circuits $LOB_1$ to $LOB_M$ are also arranged so as to correspond to the respective rows, while the output terminal of the logic circuit $LOB_m$ at the m-th row is connected to the input terminal of the buffer $BB_m$ through the other of the two signal output terminals 63 provided for each row.

A first enable line $En_A$ is connected to one input terminal each of the logic circuits $LOA_1$ to $LOA_M$, whereby a first control input signal $enable_1$ is supplied from the enable line $En_A$ to the logic circuits $LOA_1$ to $LOA_M$. Connected to the other input terminals of the logic circuits $LOA_1$ to $LOA_M$ are output terminals of the shift register circuits 43 corresponding to their rows. A second enable line $En_B$ is connected to one input terminal each of the logic circuits $LOB_1$ to $LOB_M$, whereby a second control input signal $enable_2$ is supplied from the enable line $En_B$ to the logic circuits $LOB_1$ to $LOB_M$. Connected to the other input terminals of the logic circuits LOB$_1$ to LOB$_M$ are output terminals of the shift register circuits 43 corresponding to their rows.

The logic circuits LOA$_1$ to LOA$_M$ output the respective row selection signals VSA$_1$ to VSA$_M$ so as to close the transistors 21 when both of the control input signal enable$_1$ and output signals Sout$_1$ to Sout$_M$ from their corresponding shift register circuits 43 are significant values. Similarly, the logic circuits LOB$_1$ to LOB$_M$ output the respective row selection signals VSB$_1$ to VSB$_M$ so as to close the transistors 22 when both of the control input signal enable$_2$ and output signals Sout$_1$ to Sout$_M$ from their corresponding shift register circuits 43 are significant values. The logic circuits LOA$_1$ to LOA$_M$ and LOB$_1$ to LOB$_M$ are illustrated by symbols representing AND circuits in FIG. 10, but may be constructed by combinations of various other logic circuits.

The vertical shift register section 60B acts as with the vertical shift register section 60A illustrated in FIG. 8. Here, it is desirable for the first and second control input signals enable$_1$, enable$_2$ to have a signal waveform identical to the signal waveform of the control input signal enable in (g) in FIG. 8.

The above-described embodiment can employ the vertical shift register section 60B of this modified example in place of the vertical shift register section 60A. Effects similar to those of the above-described embodiment can favorably be exhibited in this case as well.

Second Modified Example

Figure 11:
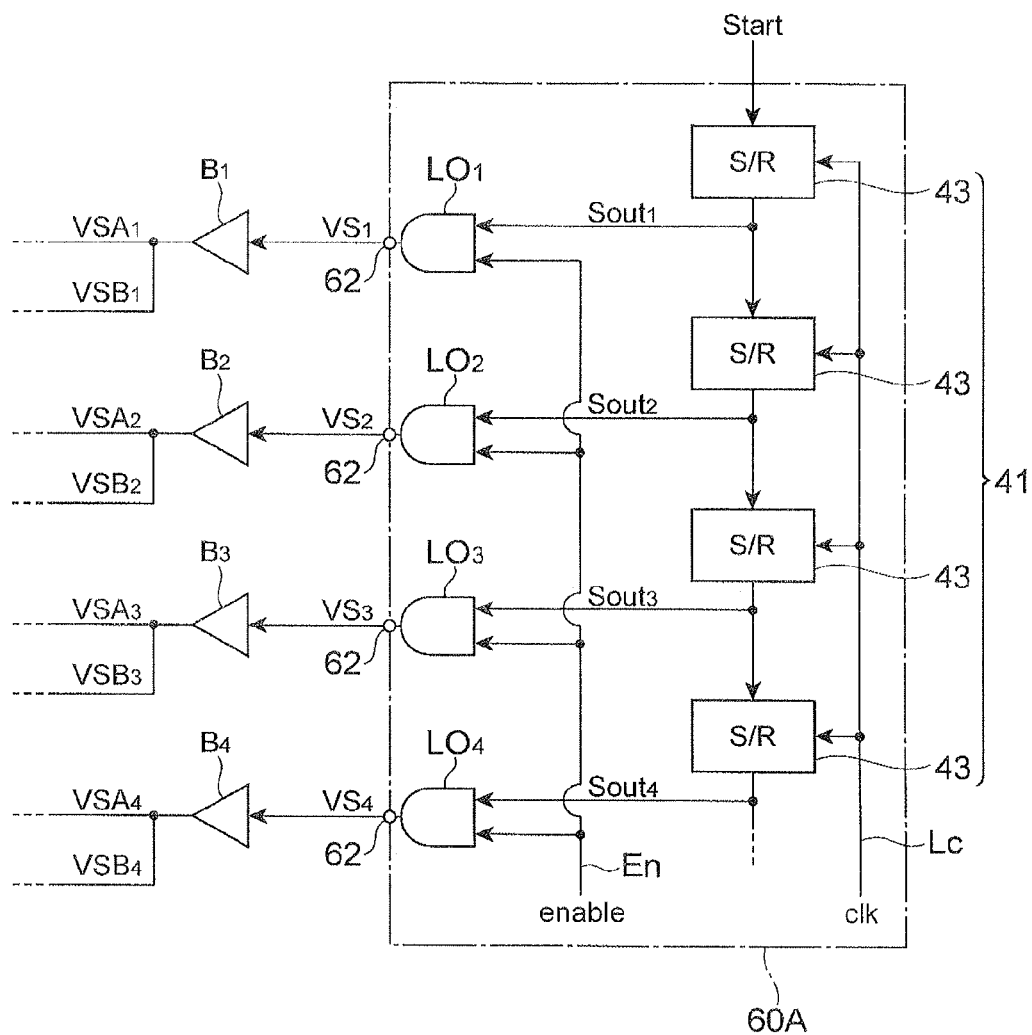
FIG. 11 is a circuit diagram illustrating a configuration of a second modified example.

FIG. 11 is a circuit diagram illustrating a configuration of a second modified example of the above-described embodiment. Unlike the above-described embodiment, each row is provided with one buffer in this modified example. Specifically, this solid-state imaging device comprises M buffers B$_1$ to B$_M$ having output terminals connected to both of M first row selection lines QA$_1$ to QA$_M$ and M second row selection lines QB$_1$ to QB$_M$.

The vertical shift register section 60A has M signal output terminals 62 provided one by one for the respective, rows in order to output the row selection signals VS$_1$ to VS$_M$, and the signal output terminals 62 are connected to the input terminals of the buffers B$_1$ to B$_M$ at their corresponding rows. The vertical shift register section 60A provides the input terminal of the buffer B$_m$ with the row selection signal VS$_m$ at the m-th row. The output signal from the buffer B$_m$ is supplied as row selection signals VSA$_m$, VSB$_m$ to the row selection lines QA$_m$, QB$_m$.

Effects similar to those of the above-described embodiment can favorably be exhibited also when each row is provided with one buffer whose output signal is split into the row selection signals VSA$_m$, VSB$_m$ as in this modified example. However, providing the row selection lines QA$_m$, QB$_m$ with respective buffers as in the above-described embodiment further inhibits failures caused by short circuits in one row selection line from affecting the other row selection line. Therefore, the mode of the above-described embodiment is more preferred.

Third Modified Example

Figure 12:
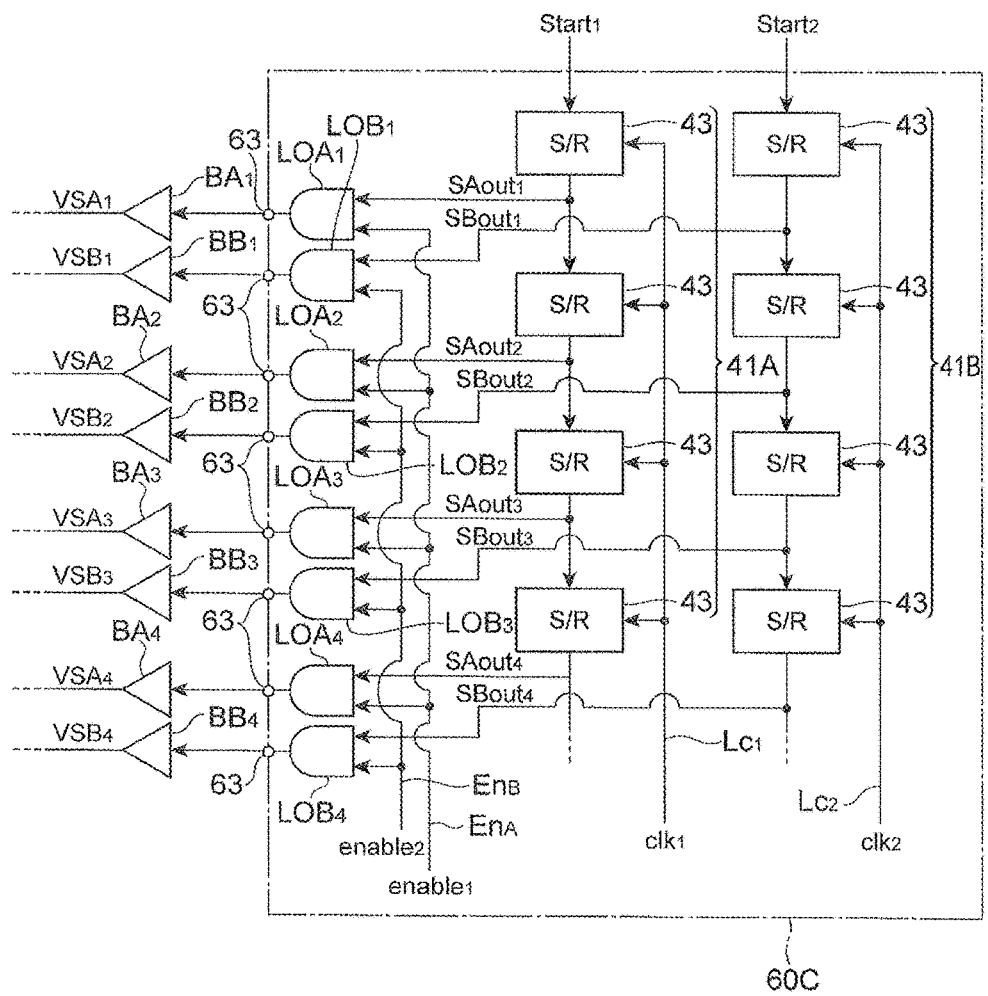
FIG. 12 is a circuit diagram illustrating a detailed configuration of a vertical shift register section as a third modified example.

FIG. 12 is a circuit diagram illustrating a detailed configuration of a vertical shift register section 60C as a third modified example of the above-described embodiment. The vertical shift register section 60C of this modified example differs from the vertical shift register section 60B of the first modified example in the following points.

As illustrated in FIG. 12, the vertical shift register section 60C has a first shift register array 41A and a second register array 41B in place of the shift register array 41 in the first modified example. The shift register array 41A is constructed by connecting in series M shift register circuits 43 arranged one by one for the respective rows, while a clock line Lc$_1$ is connected to the shift register circuits 43, whereby each shift register circuit 43 is provided with a clock signal clk$_1$ having a fixed period from the clock line Lc$_1$. The shift register array 41B is constructed by connecting in series M shift register circuits 43 arranged one by one for the respective rows, while a clock line Lc$_2$ is connected to the shift register circuits 43, whereby each shift register circuit 43 is provided with a clock signal clk$_2$ having a fixed period from the clock line Lc$_2$. Preferably, the clock signals clk$_1$, clk$_2$ are clock signals having periods identical to each other and operate at the same timing.

The first enable line En$_A$ is connected to one input terminal each of the logic circuits LOA$_1$ to LOA$_M$, whereby the first control input signal enable$_1$ is supplied from the enable line En$_A$ to the logic circuits LOA$_1$ to LOA$_M$. Connected to the other input terminals of the logic circuits LOA$_1$ to LOA$_M$ are output terminals of the shift register circuits 43 corresponding to their rows in the first shift register array 41A. The second enable line En$_B$ is connected to one input terminal each of the logic circuits LOB$_1$ to LOB$_M$, whereby the second control input signal enable$_2$ is supplied from the enable line En$_B$ to the logic circuits LOB$_1$ to LOB$_M$. Connected to the other input terminals of the logic circuits LOB$_1$ to LOB$_M$ are output terminals of the shift register circuits 43 corresponding to their rows in the second shift register array 41B.

The logic circuits LOA$_1$ to LOA$_M$ output the respective row selection signals VSA$_1$ to VSA$_M$ so as to close the transistors 21 when both of the control input signal enable$_1$ and output signals SAout$_1$ to SAout$_M$ from their corresponding shift register circuits 43 are significant values. Similarly, the logic circuits LOB$_1$ to LOB$_M$ output the respective row selection signals VSB$_1$ to VSB$_M$ so as to close the transistors 22 when both of the control input signal enable$_2$ and output signals SBout$_1$ to SBout$_M$ from their corresponding shift register circuits 43 are significant values.

The vertical shift register section 60C acts as with the vertical shift register section 60A illustrated in FIG. 8. Here, it is desirable for respective start signals Start$_1$, Start$_2$ input to the shift register arrays 41A, 41B to have a signal waveform identical to the signal waveform of the start signal Start in (a) in FIG. 8. It is desirable for the clock signals clk$_1$, clk$_2$ to have a signal waveform identical to the signal waveform of the clock signal clk in (b) in FIG. 8. It is desirable for the first and second control input signals enable$_1$, enable$_2$ to have a signal waveform identical to the signal waveform of the control input signal enable in (g) in FIG. 8.

The above-described embodiment can employ the vertical shift register section 60C of this modified example in place of the vertical shift register section 60A. Effects similar to those of the above-described embodiment can favorably be exhibited in this case as well.

Fourth Modified Example

Figure 13:
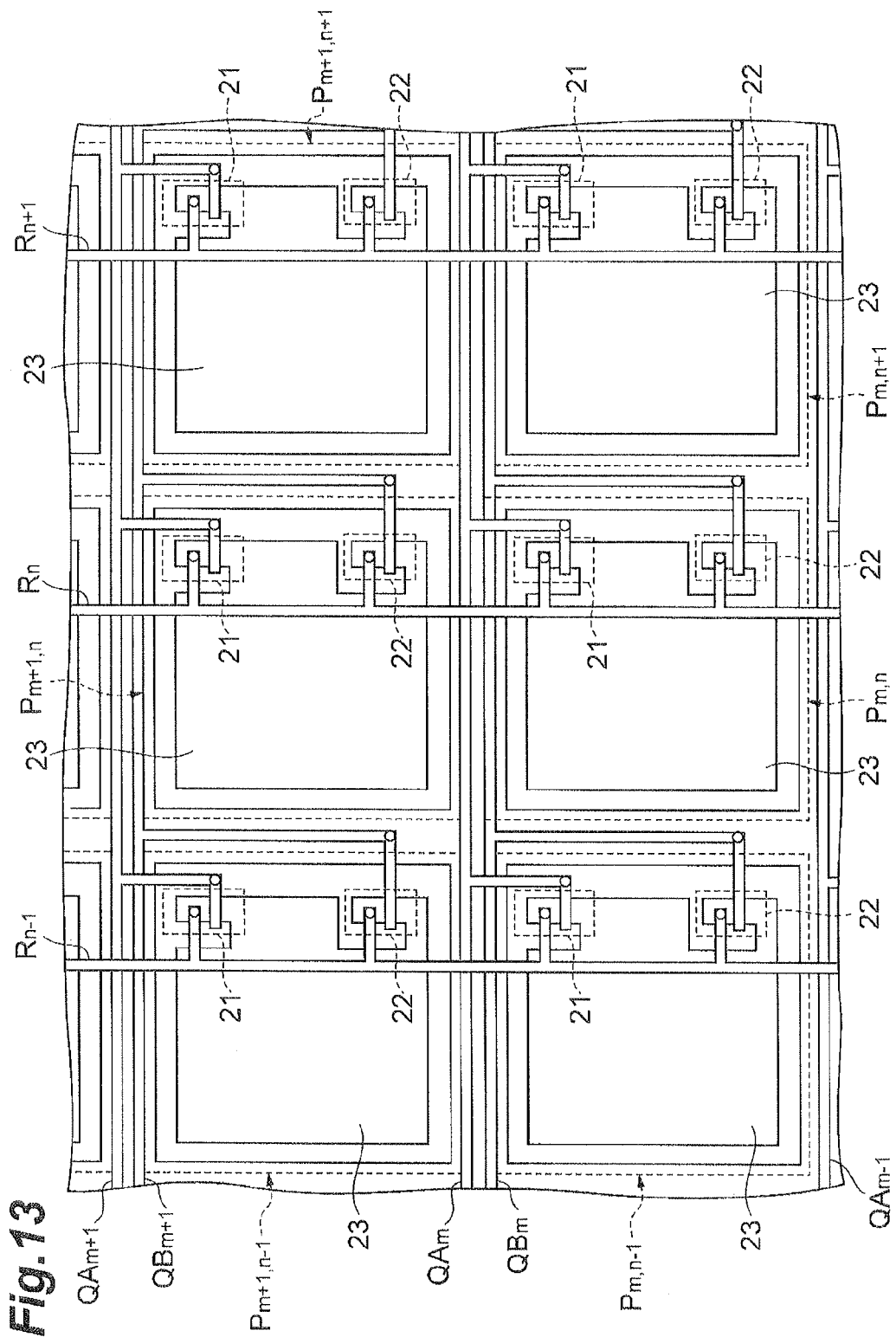
FIG. 13 is a plan view illustrating and enlarging a part of a photodetecting section as a fourth modified example.

FIG. 13 is a plan view illustrating a part of a photodetecting section under magnification as a fourth modified example of the above-described embodiment. As illustrated in FIG. 13, this modified example differs from the above-described embodiment in that both of the row selection lines $QA_1$ to $QA_M$ and $QB_1$ to $QB_M$ are disposed in regions between pixels. Specifically, the row selection lines $QA_m$, $QB_m$ of m-th row are disposed between the pixels $P_{m,1}$ to $P_{m,N}$ at the m-th row and the pixels $P_{m+1,1}$ to $P_{m+1,N}$ at the (m+1)-th row.

Such a configuration of this modified example can prevent the row selection lines $QA_1$ to $QA_M$ or $QB_1$ to $QB_M$ from obstructing light incident on the pixels $P_{1,1}$ to $P_{M,N}$, thereby raising the efficiency at which light is incident on the pixels $P_{1,1}$ to $P_{M,N}$. It can also keep the row selection lines $QA_1$ to $QA_M$ and $QB_1$ to $QB_M$ away from the photodiodes 23 of the pixels $P_{1,1}$ to $P_{M,N}$, thereby suppressing the fluctuation of the amount of charges in the photodiodes 23 caused by the voltage change in the row selection lines $QA_1$ to $QA_M$ and $QB_1$ to $QB_M$.

The row selection lines $QA_1$ to $QA_M$ and the row selection lines $QB_1$ to $QB_M$ may be disposed in parallel with each other in the layer stacking direction. For example, a wiring layer including the row selection lines $QB_1$ to $QB_M$ may be added onto a wiring layer including the row selection lines $QA_1$ to $QA_M$. This can increase the gap between the row selection lines $QB_1$ to $QB_M$ and the reference potential line, thereby lowering the probability of the row selection lines $QB_1$ to $QB_M$ and the reference potential line short-circuiting to each other.

The solid-state imaging device in accordance with the present invention is not limited to the above-described embodiment but can be modified in various ways. For example, the photodetecting section illustrated in the above-described embodiment may comprise a configuration in which a film of polycrystalline silicon or amorphous silicon is formed on a glass substrate. In this case, the transistors 21, 22 are favorably constructed by thin-film transistors. The photodetecting section may also be made on a monocrystalline silicon substrate.

The row selection signals $VSA_m$, $VSB_m$ are input to two row selection lines $QA_m$, $QB_m$ for the same row at the same timing in the above-described embodiment, but the row selection signals $VSA_m$, $VSB_m$ may be input to two row selection lines $QA_m$, $QB_m$ for the same row at the same timing only partly or at timings different from each other in the first modified example and the third modified example.

Here, a solid-state imaging device including all of the above-described embodiment and first to third modified examples has a configuration comprising:
a photodetecting section having M×N pixels (each of M and N being an integer of 2 or more), each including one photodiode and first and second switch circuits each having one terminal connected to the one photodiode, two-dimensionally arrayed in M rows and N columns; N readout lines provided for the respective columns and connected to the other terminals of the first and second switch circuits included in the pixels of the corresponding columns;
M first row selection lines provided for the respective rows and connected to control terminals of the first switch circuits included in the pixels of the corresponding rows;
M second row selection lines provided for the respective rows and connected to control terminals of the second switch circuits included in the pixels of the corresponding rows; and
a shift register section for generating a row selection signal for controlling an open/closed state of the first and second switch circuits for each row and providing the first and second row selection lines with the row selection signal.

A solid-state imaging device including the above-described first and third modified examples has a configuration further comprising:

M first buffers having respective output terminals connected to the M first row selection lines; and
M second buffers having respective output terminals connected to the M second row selection lines;
the shift register section having (2×M) signal output terminals provided two by two for the respective rows for outputting the row selection signal; at each row, one signal output terminal of the two signal output terminals being connected to the input terminal of the first buffer, the other signal output terminal being connected to the input terminal of the second buffer.

A solid-state imaging device including the above-described second modified example has a configuration further comprising:
M buffers having respective output terminals connected to the M first row selection lines and M second row selection lines;
the shift register section having M signal output terminals provided one by one for the respective rows for outputting the row selection signal;
the signal output terminals being connected to input terminals of the buffers of the corresponding rows.

The solid-state imaging device in accordance with the above-described embodiment uses a configuration comprising a photodetecting section having M×N pixels (each of M and N being an integer of 2 or more), each including one photodiode and first and second switch circuits each having one terminal connected to the one photodiode, two-dimensionally arrayed in M rows and N columns; N readout lines provided for the respective columns and connected to the other terminals of the first and second switch circuits included in the pixels of the corresponding columns; M first row selection lines provided for the respective rows and connected to control terminals of the first switch circuits included in the pixels of the corresponding rows; M first buffers having respective output terminals connected to the M first row selection lines; M second row selection lines provided for the respective rows and connected to control terminals of the second switch circuits included in the pixels of the corresponding rows; M second buffers having respective output terminals connected to the M second row selection lines; and a shift register section for generating a row selection signal for controlling an opening/closing state of the first and second switch circuits for each row and providing input terminals of the first and second buffers with the common row selection signal; the shift register section having M signal output terminals provided one by one for the respective rows for outputting the row selection signal; the signal output terminals being connected to the input terminals of the first and second buffers of the corresponding rows.

The solid-state imaging device may have a configuration in which the first and second row selection lines are disposed in a region between the pixels. This can prevent the row selection lines from obstructing light incident on each pixel, thereby enhancing the efficiency at which light is incident on each pixel. It can also keep the row selection lines away from the photodiodes of the pixels, thereby suppressing the fluctuation of the amount of charges in the photodiodes caused by the voltage change in the row selection lines.

The solid-state imaging device may have a configuration in which one row selection line of the first and second row selection lines is disposed in a region between the pixels, while the other row selection line is disposed on the pixel. This can place the two row selection lines such that they are separated from each other, thereby enhancing the yield at the time of manufacturing the solid-state imaging device. In this case, for suppressing the fluctuation of the amount of charges in the photodiodes caused by the voltage fluctuation in the other row selection line, it will be more preferred if a reference potential line is disposed between the other row selection line and the pixel.

INDUSTRIAL APPLICABILITY

The present invention can be utilized as a solid-state imaging device which can read charges from each pixel even when a row selection line fails.

REFERENCE SIGNS LIST

1A—solid-state imaging device, 12—silicon substrate, 13—scintillator, 15, 19—reference potential line, 18—pixel separation region, 20—photodetecting section, 21—transistor (first switch circuit), 22—transistor (second switch circuit), 23—photodiode, 40—readout circuit section, 41, 41A, 41B—shift register array, 42—integration circuit, 43—shift register circuit, 44—holding circuit, 45—hold line, 46—reset line, 48—voltage output line, 60A to 60C—vertical shift register section, 61—horizontal shift register section, 62, 63—signal output terminal, $BA_1$ to $BA_M$, $BB_1$ to $BB_M$—buffer, $P_{1,1}$ to $P_{M,N}$—pixel, $QA_1$ to $QA_M$—first row selection line, $QB_1$ to $QB_M$—second row selection line, $R_1$ to $R_N$—readout line, $VS_1$ to $VS_M$—row selection signal, $VSA_1$ to $VSA_M$—first row selection signal, $VSB_1$ to $VSB_M$—second row selection signal.

The invention claimed is:

1. A solid-state imaging device comprising:

a photodetecting section having M×N pixels (each of M and N being an integer of 2 or more), each including one photodiode and first and second switch circuits each having one terminal connected to the one photodiode, two-dimensionally arrayed in M rows and N columns;

N readout lines provided for the respective columns and connected to the other terminals of the first and second switch circuits included in the pixels of the corresponding columns;

M first row selection lines provided for the respective rows and connected to control terminals of the first switch circuits included in the pixels of the corresponding rows;

M first buffers having respective output terminals connected to the M first row selection lines;

M second row selection lines provided for the respective rows and connected to control terminals of the second switch circuits included in the pixels of the corresponding rows;

M second buffers having respective output terminals connected to the M second row selection lines; and a shift register section for generating a row selection signal for controlling an open/closed state of the first and second switch circuits for each row and providing input terminals of the first and second buffers with the common row selection signal, wherein the shift register section has M signal output terminals provided one by one for the respective rows for outputting the row selection signal, the signal output terminals being connected to the input terminals of the first and second buffers of the corresponding rows.

2. The solid-state imaging device according to claim 1, wherein the first and second row selection lines are disposed in a region between the pixels.

3. The solid-state imaging device according to claim 1, wherein one row selection line of the first and second row selection lines is disposed in a region between the pixels, and the other row selection line is disposed on the pixel.

4. The solid-state imaging device according to claim 3, further comprising a reference potential line disposed between the other row selection line and the pixel.

\* \* \* \* \*